US012627259B2

(12) United States Patent
Cheng et al.

(10) Patent No.: US 12,627,259 B2
(45) Date of Patent: May 12, 2026

(54) ISOLATED POWER SUPPLY CHIP BASED ON SYMMETRICAL CLASS-D OSCILLATOR WITH DEAD ZONE CONTROL

(71) Applicant: UNIVERSITY OF SCIENCE AND TECHNOLOGY OF CHINA, Anhui (CN)

(72) Inventors: Lin Cheng, Anhui (CN); Dongfang Pan, Anhui (CN)

(73) Assignee: University of Science and Technology of China, Hefei (CN)

( * ) Notice: Subject to any disclaimer, the term of this patent is extended or adjusted under 35 U.S.C. 154(b) by 0 days.

(21) Appl. No.: 18/834,946

(22) PCT Filed: Feb. 16, 2022

(86) PCT No.: PCT/CN2022/076474
§ 371 (c)(1),
(2) Date: Jul. 31, 2024

(87) PCT Pub. No.: WO2023/155070
PCT Pub. Date: Aug. 24, 2023

(65) Prior Publication Data
US 2025/0125770 A1      Apr. 17, 2025

(51) Int. Cl.
*H03B 5/12* (2006.01)
*H02M 1/38* (2007.01)

(52) U.S. Cl.
CPC .......... *H03B 5/1212* (2013.01); *H02M 1/385* (2021.05); *H03B 5/1215* (2013.01); *H03B 5/1228* (2013.01); *H03B 5/1296* (2013.01)

(58) Field of Classification Search
CPC ........ H02M 1/38; H02M 1/385; H02M 3/335; H02M 3/33523; H03B 5/1212; H03B 5/1215; H03B 5/1228; H03B 5/1296
See application file for complete search history.

(56) References Cited

U.S. PATENT DOCUMENTS

| | | | | |
|---|---|---|---|---|
| 8,149,067 B2 * | 4/2012 | Okada | .................. | H03B 5/1243 |
| | | | | 331/117 FE |
| 9,812,989 B1 * | 11/2017 | Dupuis | ................... | H01L 25/18 |

(Continued)

FOREIGN PATENT DOCUMENTS

| | | |
|---|---|---|
| CN | 101753100 A | 6/2010 |
| CN | 102177645 A | 9/2011 |

(Continued)

*Primary Examiner* — Levi Gannon
(74) *Attorney, Agent, or Firm* — Christensen, Fonder, Dardi & Herbert PLLC; John P. Fonder

(57) ABSTRACT
An isolated power supply chip based on a symmetrical Class-D oscillator with dead zone control is provided, including: a transmitting stage oscillator circuit connected to a power supply and a ground, the oscillator circuit is configured to invert an input DC voltage into differential high-frequency oscillation power signals and input the signals to a primary coil of a transformer; a rectifier circuit connected to a secondary coil of the transformer and configured to rectify the signals to output a DC voltage signal; and a feedback control circuit configured to feed back the DC voltage signal to the oscillator circuit; the oscillator circuit comprises: a dead zone control module, and a NMOS transistor group and a PMOS transistor group connected to the dead zone control module that are symmetrically arranged, the dead zone control module is configured to control the transistor groups to eliminate a short circuit current.

8 Claims, 5 Drawing Sheets

(56)                           References Cited

U.S. PATENT DOCUMENTS

| 9,948,193 B2 * | 4/2018 | Ragonese ......... H02M 3/33584 |
| 10,068,702 B2 * | 9/2018 | Posat .................... H01L 23/645 |
| 10,298,408 B2 * | 5/2019 | Ragonese ............... H04B 3/54 |
| 2006/0039169 A1 * | 2/2006 | Chen ................... H02M 3/3374 |
| | | 363/17 |
| 2009/0289732 A1 * | 11/2009 | Miyashita ............ H03B 5/1265 |
| | | 331/117 FE |
| 2010/0052630 A1 | 3/2010 | Chen |
| 2012/0001699 A1 | 1/2012 | Yang et al. |
| 2015/0180528 A1 * | 6/2015 | Ragonese ......... H02M 3/33592 |
| | | 375/219 |
| 2016/0080181 A1 * | 3/2016 | Yun ...................... H03B 5/1215 |
| | | 375/312 |
| 2016/0373057 A1 * | 12/2016 | Farazian ................ H03B 27/00 |
| 2018/0205319 A1 * | 7/2018 | Zhuo ................. H02M 3/33523 |
| 2020/0036284 A1 | 1/2020 | Qin et al. |

FOREIGN PATENT DOCUMENTS

| CN | 102412785 A | 4/2012 |
| CN | 107645300 A | 1/2018 |
| CN | 108199687 A | 6/2018 |
| CN | 112467991 A | 3/2021 |
| CN | 112652615 A | 4/2021 |

* cited by examiner

ISOLATED POWER SUPPLY CHIP BASED ON SYMMETRICAL CLASS-D OSCILLATOR WITH DEAD ZONE CONTROL

CROSS-REFERENCE TO RELATED APPLICATION(S)

This application is a Section 371 National Stage Application of International Application No. PCT/CN2022/076474, filed on Feb. 16, 2022, entitled "ISOLATED POWER CHIP BASED ON DEADBAND CONTROL SYMMETRICAL CLASS-D OSCILLATOR", the content of which is incorporated herein by reference in its entirety.

TECHNICAL FIELD

The present disclosure relates to a field of isolated power supply technology, and in particular, to an isolated power supply chip based on a symmetrical Class-D oscillator with dead zone control.

BACKGROUND

Isolated power supply chips are widely used in automotive electronics, biomedical, defense electronic systems, communication systems and other fields. Especially when noise-sensitive equipment operates under some extreme conditions, the isolated power supply chips play a vital role in ensuring the safety and reliability of the equipment. As a size of the isolated power supply becomes smaller and smaller, the frequency and power density of a power oscillation signal inside the chip are getting higher and higher. The isolated power supply chip often becomes a radiation source and interferes with other electronic equipment, that is, there may be a problem of electromagnetic interference (EMI). The radiation source includes unilateral radiation and dipole radiation. The unilateral radiation may generally be solved by bypass capacitors on two sides of the isolated power supply. The main problem of the isolated power supply chip is that the dipole radiation from input to output is difficult to eliminate, and EMI testing is an important certification project before electronic devices become products. However, the traditional methods of reducing EMI for isolated power supply chip are through the application level, that is, using at least four layers of staggered capacitors and ferrite bead devices on the PCB board, which greatly increases the design cost and may not fundamentally solve the EMI radiation problem. Furthermore, there are also technical problems such as low conversion efficiency.

SUMMARY

The present disclosure provides an isolated power supply chip based on a symmetrical Class-D oscillator with dead zone control, including: a transmitting stage oscillator circuit connected to a power supply and a ground, wherein the transmitting stage oscillator circuit is configured to invert an input DC voltage into differential high-frequency oscillation power signals and input the differential high-frequency oscillation power signals to a primary coil of a subsequent transformer; a rectifier circuit connected to a secondary coil of the transformer and configured to rectify the differential high-frequency oscillation power signals to output a DC voltage signal; and a feedback control circuit connected to the rectifier circuit and configured to feed back the DC voltage signal to the transmitting stage oscillator circuit, thereby modulating and stabilizing the DC voltage signal;

wherein the transmitting stage oscillator circuit comprises: a dead zone control module, and a NMOS transistor group and a PMOS transistor group connected to the dead zone control module that are symmetrically arranged, the dead zone control module is configured to control a turn-on and a turn-off of the NMOS transistor group and the PMOS transistor group to eliminate a short circuit current between the power supply and the ground.

Optionally, the dead zone control module is configured to control the turn-on and the turn-off of the NMOS transistor group and the PMOS transistor group by sampling the high-frequency oscillation power signals at two ends of the primary coil of the transformer, so as to achieve a dead zone control.

Optionally, the dead zone control module is configured to control a turn-on and a turn-off of each power transistor of the NMOS transistor group and PMOS transistor group by outputting a control voltage signal according to the sampled high-frequency oscillation power signals at two ends of the primary coil of the transformer, so as to achieve the dead zone control.

Optionally, the NMOS transistor group comprises a first NMOS transistor and a second NMOS transistor; the PMOS transistor group comprises a first PMOS transistor and a second PMOS transistor.

Optionally, the isolated power supply chip further includes: a switch, wherein one end of the switch is connected to the ground or the power supply, and another end of the switch is connected to the transmitting stage oscillator circuit, the switch is configured to control whether the transmitting stage oscillator circuit oscillates or not by switching on and switching off according to the DC voltage signal fed back by the feedback control circuit.

Optionally, the transmitting stage oscillator circuit includes states of:

state 1: a second NMOS transistor and a first PMOS transistor are turned on, and an inductor current $I_L$ is negative;

state 2: the second NMOS transistor and the first PMOS transistor are turned on, and the inductor current $I_L$ is positive;

state 3: the second NMOS transistor and the first PMOS transistor are turned off, and voltages $V_{GN2}$ and $V_{GP1}$ output by the dead zone control module reach $V_{THN}$ and $V_{DD}-|V_{THP}|$, respectively, while a dead time is generated, all four power transistors are turned off, and the inductor current $I_L$ freewheels;

state 4: a first NMOS transistor and a second PMOS transistor are turned on, and the inductor current $I_L$ is positive;

state 5: the first NMOS transistor and the second PMOS transistor are turned on, and the inductor current $I_L$ is negative; and state 6: the first NMOS transistor and the second PMOS transistor are turned off, voltages $V_{GN1}$ and $V_{GP2}$ output by the dead zone control module reach $V_{THN}$ and $V_{DD}-|V_{THP}|$, respectively, while a dead time is generated, all four power transistors are turned off, and the inductor current $I_L$ freewheels;

where a threshold voltage of the NMOS transistor group is $V_{THN}$, a threshold voltage of the PMOS transistor group is $V_{THP}$, a high-frequency oscillation power signal corresponding to a first end of the primary coil of the transformer is $V_{PP}$, a high-frequency oscillation power signal corresponding to a second end of the primary coil of the transformer is $V_{PN}$, the inductor current generated by the primary coil of the transformer is $I_L$, and a voltage of the power supply is $V_{DD}$, $V_{GN1}$ is a gate voltage of the first NMOS transistor output by the dead zone control module, $V_{GN2}$ is a gate voltage of the second NMOS transistor output by the dead zone control module, $V_{GP1}$ is a gate voltage of the first PMOS transistor output by the dead zone control module, and $V_{GP2}$ is a gate voltage of the second PMOS transistor output by the dead zone control module.

Optionally, the dead zone control module includes a first bias voltage, a second bias voltage, a first bias resistor, a second bias resistor, a third bias resistor, a fourth bias resistor, a first coupling capacitor, a second coupling capacitor, a third coupling capacitor, and a fourth coupling capacitor.

Optionally, a gate electrode of the first NMOS transistor is connected to a drain electrode of the second NMOS transistor through the first coupling capacitor, a gate electrode of the second NMOS transistor is connected to a drain electrode of the first NMOS transistor through the second coupling capacitor, a gate electrode of the first PMOS transistor is connected to a drain electrode of the second PMOS transistor through the third coupling capacitor, and a gate electrode of the second PMOS transistor is connected to a drain electrode of the first PMOS transistor through the fourth coupling capacitor.

Optionally, the first bias voltage is connected to the gate electrode of the first NMOS transistor through the first bias resistor, and is connected to the gate electrode of the second NMOS transistor through the second bias resistor; the second bias voltage is connected to the gate electrode of the first PMOS transistor through the third bias resistor, and is connected to the gate electrode of the second PMOS transistor through the fourth bias resistor.

Optionally, the first bias voltage or the second bias voltage is used to adjust a common-mode voltage of the NMOS transistor group or the PMOS transistor group, so as to achieve the dead zone control.

For the isolated power supply chip based on a symmetrical Class-D oscillator with dead zone control of the present disclosure, an instantaneous short-circuit current between the power supply and the ground is avoided by setting a sequence of turning on and turning off the power transistors through the oscillator (oscillator circuit) topology, so as to improve the power conversion efficiency and reliability of the oscillator and increase the service life of the power transistor. The common-mode current is suppressed to reduce dipole radiation and achieve low EMI radiation solution at the device level. There is no need to use high-voltage LDMOS, and only low-voltage MOS transistors are needed. The low-voltage MOS transistors have lower on-resistance, which effectively improves the conversion efficiency of the oscillator and reduces process costs.

REFERENCE SIGNS

Figure 1:
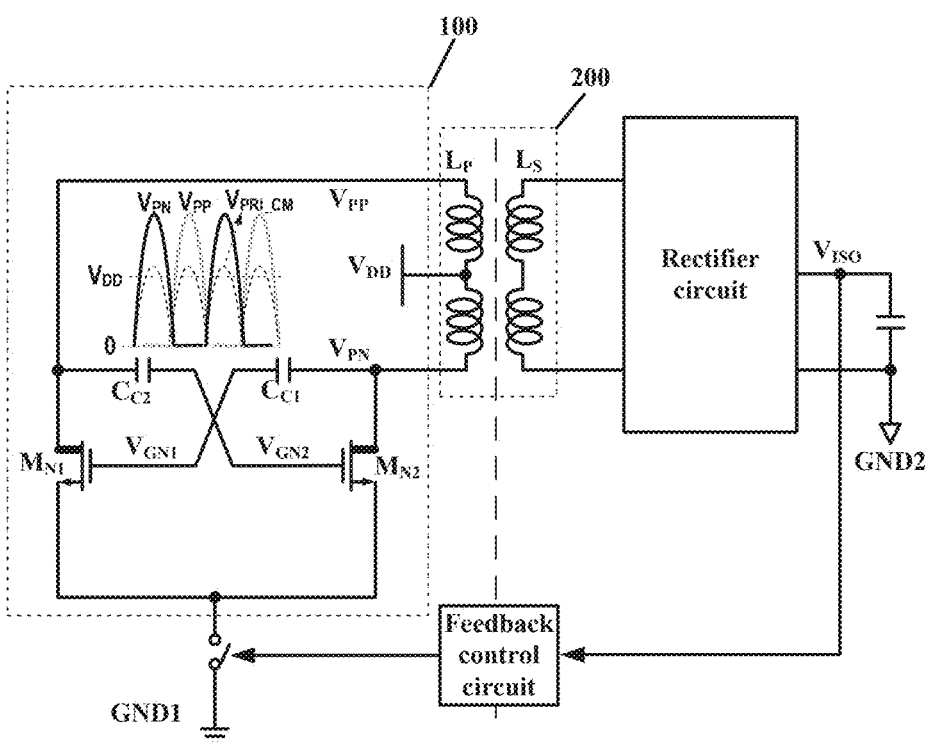
FIG. 1 is a system block diagram of an isolated power supply chip based on a traditional cross-coupled LC oscillator.

100—Oscillator;
200—Transformer;
10—Transmitting stage oscillator circuit;
20—Transformer;
30—Rectifier circuit;
40—Feedback control circuit;
101—Dead zone control module;
102—Switch.

DETAILED DESCRIPTION OF EMBODIMENTS

The present disclosure provides an isolated power supply chip based on a symmetrical Class-D oscillator with dead zone control. A short-circuit current is avoided by setting a sequence of turning on and turning off the power transistors through the oscillator (oscillator circuit) topology, so as to improve the power conversion efficiency and reliability of the oscillator.

The isolated power supply chip generally includes three parts, namely DC-AC inverter circuit at a transmitting end, AC-AC power transfer isolation barrier using a transformer, and AC-DC rectifier circuit at a receiving end. How to reduce EMI radiation at the device level while improving the efficiency of the converter is an important technical issue faced by the isolated power supply chip. Dipole radiation is a radiation source formed by a large-swing common-mode voltage on primary and secondary sides of the transformer generating a high common-mode current on a distributed parasitic capacitance. Based on this, the present disclosure provides a transmitting end topology of a symmetrical Class-D oscillator with dead zone control for the dipole radiation as main radiation source in the isolated power supply chip. The main technical problem to be solved by the present disclosure is to reduce the common-mode current of the system from the chip level through a fully symmetrical structure of the transmitting end of the isolated power supply, and to reduce EMI radiation. For example, when the differential oscillation signal of a complementary Class-D oscillator flips, four power transistors are turned on simultaneously, and there may be an instantaneous short-circuit current from the power supply to the ground through the power transistors. On the one hand, the extra loss reduces the power conversion efficiency of the oscillator; on the other hand, the power transistor is damaged and causing the chip to fail. Based on this, the present disclosure provides a dead zone control method of short-circuit current cancellation technology for the problem of short-circuit current of the complementary Class-D oscillator. By setting the sequence of turning on and turning off the power transistors through the oscillator topology, the short-circuit current is avoided, thereby improving the power conversion efficiency and reliability of the oscillator.

The dipole radiation is the main radiation generated by the isolated power supply, and the dipole radiation is generated by radiation through an equivalent dipole antenna because the current on the isolation barrier may not form a loop. There is no actual physical loop between the reference grounds on two sides and the dipole radiation may only be radiated in a form of electromagnetic waves, so the radiation source is difficult to be eliminated. When the common-mode voltage generated by the oscillator at the transmitting end passes through the isolation barrier, a common-mode current $I_{CM}$ is generated due to a distributed parasitic capacitance between the primary and secondary coils of the transformer, which results in dipole radiation from the input to the output. At this time, the transformer may be regarded as a dipole antenna. The power of the dipole radiation may be expressed as:

$$P_{rad} \propto (L_{ant} f_{CM} I_{CM})^2; \qquad (1)$$

where $L_{ant}$, $f_{CM}$ and $I_{CM}$ are the length of the dipole antenna, the frequency of the common-mode current, and the amplitude of the common-mode current, respectively. The calculation equations of the common-mode current $I_{CM}$, the primary common-mode voltage and the secondary common-mode voltage are:

$$I_{CM} = C_{ISO} \frac{\partial(V_{pri\_CM} - V_{sec\_CM})}{\partial t}; \qquad (2)$$

$$\begin{cases} V_{pri\_CM} = \dfrac{V_{P1} + V_{P2}}{2} \\ V_{sec\_CM} = \dfrac{V_{S1} + V_{S2}}{2} \end{cases}; \qquad (3)$$

where $C_{ISO}$ is the parasitic capacitance between the primary coil and the secondary coil of the transformer, $V_{pri\_CM}$ and $V_{sec\_CM}$ are the primary common-mode voltage and the secondary common-mode voltage, respectively. According to equation (2), the common-mode current $I_{CM}$ may be reduced by reducing a change rate between the primary common-mode voltage and the secondary common-mode voltage.

The evaluation of EMI radiation is measured by detecting the electric field intensity of the radiation source received by a spectrum analyzer or EMI receiver. The electric field intensity quantifies the interference voltage of the radiation source, and the dipole radiation source is determined by the common-mode current. Therefore, the spectrum diagram of common-mode current is used to characterize the intensity of EMI radiation within a frequency range. The spectrum diagram of common-mode current may be obtained through circuit analysis and simulation, which is an effective method to design and optimize EMI.

The traditional isolated power supply chip needs to design and adjust the PCB layout at the application level to pass the Class-A or Class-B limits of CISPR22. For example, adding an external shield may make the system bulkier and lead to problems such as heat dissipation difficulties. Adding a safety high-voltage capacitor between the two ground planes may effectively reduce EMI radiation caused by common-mode current, but the cost is high. A low-resistance path between the two ground planes is formed by utilizing the staggered capacitance formed by the middle layer of at least four layers of PCB boards, the dipole radiation EMI radiation is suppressed by using two middle layers of PCB to form a large-area parallel plate capacitor, and application-level PCB design may always add some extra cost to the system and is not conducive to fundamentally passing the EMI standard test.

In the process of realizing the present disclosure, the inventor discovered that the DC to AC power conversion efficiency of the transmitting module in the isolated power supply chip directly affects the conversion efficiency of the entire system, and the asymmetry of the power stage topology of the transmitting module leads to greater EMI radiation. The traditional transmitting module of the isolated power supply uses a cross-coupled LC oscillator for DC-AC inverter solution. As shown in FIG. 1, the cross-coupled LC oscillator 100 generates a signal with an amplitude of $\pi$ times $V_{DD}$ on the primary side of the transformer 200. Therefore, it is required to use high-voltage LDMOS to produce the power transistor. The high-voltage LDMOS has a larger on-resistance than the low-voltage MOS transistor, and a pair of voltage dividing capacitors $C_{C1}$ and $C_{C2}$ are needed to keep the gate oscillation amplitude of the power transistors $M_{N1}$ and $M_{N2}$ at a low swing (the gate and source of LDMOS is not resistant to high voltage), which increases the conduction loss of the power transistor, and DC-AC conversion efficiency of the cross-coupled LC oscillator is limited. On the other hand, the two power transistors of the oscillator 100 are turned on alternately (0 to $\pi V_{DD}$), so the primary side of the transformer generates a high-frequency common-mode voltage $V_{PRI\_CM}$ with a swing from 0 to $\pi V_{DD}/2$. Since large common-mode current is generated due to distributed parasitic capacitance between the primary coil and secondary coil of transformer 200, the dipole radiation from output to output is generated.

Figure 2:
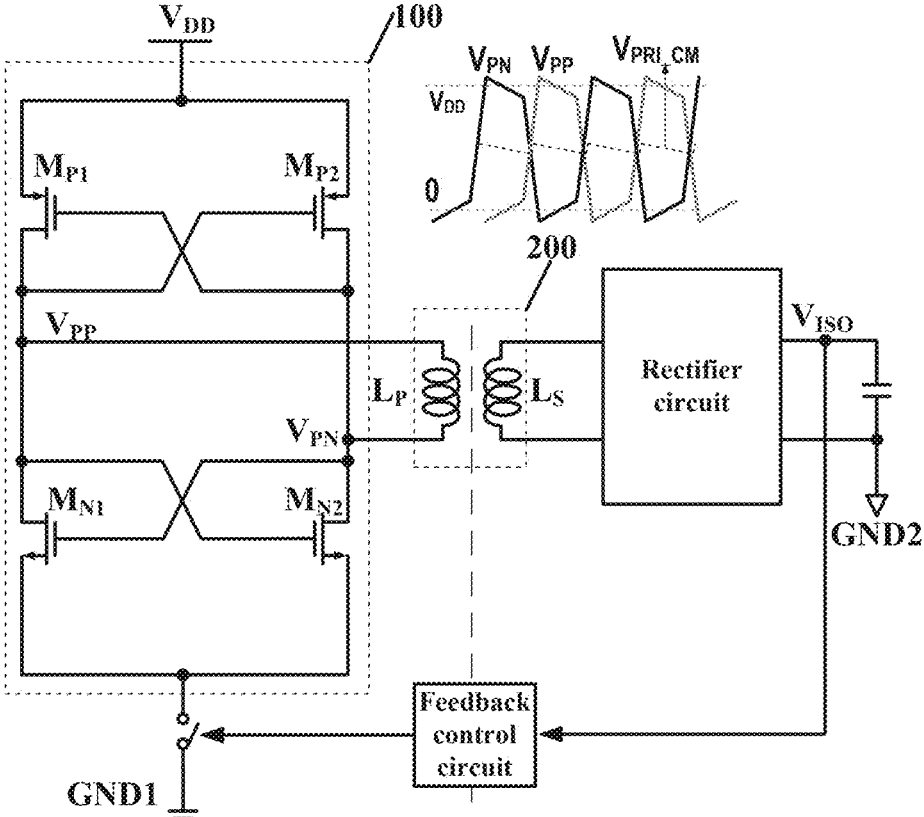
FIG. 2 is a system block diagram of an isolated power supply chip based on a traditional complementary Class-D oscillator.
Figure 3:
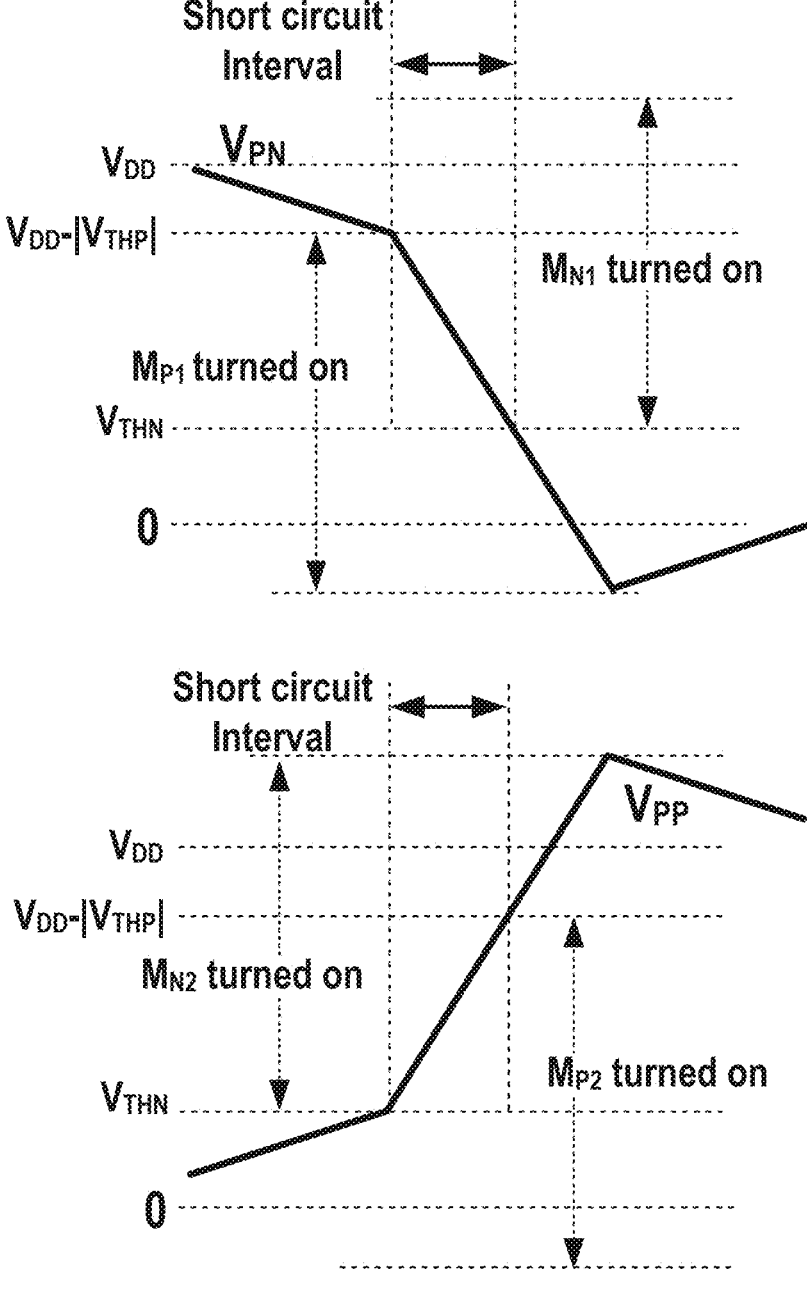
FIG. 3 is a schematic diagram of a short-circuit current generation mechanism of a traditional complementary Class-D oscillator.

As shown in FIG. 2, a pair of NMOS and a pair of PMOS form a complementary Class-D oscillator 100. Since the two groups of NMOS and PMOS alternately charge and discharge the primary coil of the transformer 200, a signal with a swing of 0 to $V_{DD}$ is formed at two ends of the transformer 200, and a common-mode voltage $V_{PRI\_CM}$ stabilized at $V_{DD}/2$ is formed on the primary side of the transformer. It may be seen from equation (2) that the symmetrical topology may greatly compress the common-mode current and thereby reduce EMI radiation. However, this structure has a big problem. As shown in FIG. 3, when the differential oscillation signal $V_{PN}$ of the complementary Class-D oscillator is in the range from $V_{THN}$ to $V_{DD}-|V_{THP}|$, $M_{N1}$ and $M_{P1}$ are both turned on. Similarly, when $V_{PP}$ is in the range from $V_{THN}$ to $V_{DD}-|V_{THP}|$ ($V_{THN}$ and $|V_{THP}|$ are the threshold voltages of NMOS and PMOS respectively), $M_{N2}$ and $M_{P2}$ are both turned on. In these two ranges, there may be a short-circuit current from the power supply $V_{DD}$ to the ground, and the short-circuit current passes through the power transistor. On the one hand, additional losses may significantly reduce the power conversion efficiency of the oscillator; on the other hand, the power transistor may be burned out and the chip may fail.

From the above, it may be seen that the cross-coupled LC oscillator generates a common-mode voltage with an amplitude of $\pi V_{DD}/2$ and a frequency of twice the resonant frequency on the primary side of the transformer, so a large dipole radiation is therefore produced. The output voltage swing of a cross-coupled LC oscillator is $\pi V_{DD}$, so a high-voltage LDMOS is required, which increases conduction loss, reduces efficiency, and requires the support of a high-voltage BCD process. In the complementary Class-D oscillator, at the moment when the oscillation signal flips, four power transistors are turned on simultaneously. The short-circuit current from $V_{DD}$ to ground is generated and will greatly reduce the efficiency and damage the power transistors. Therefore, solving the EMI radiation problem of isolated power supply at the device level and improving conversion efficiency may greatly reduce product development costs and shorten the design cycle, and a low-cost and high-efficiency power-stage transmitting end topology of isolated power supply is required.

The embodiments of the present disclosure will be further described below with reference to the drawings.

Figure 4:
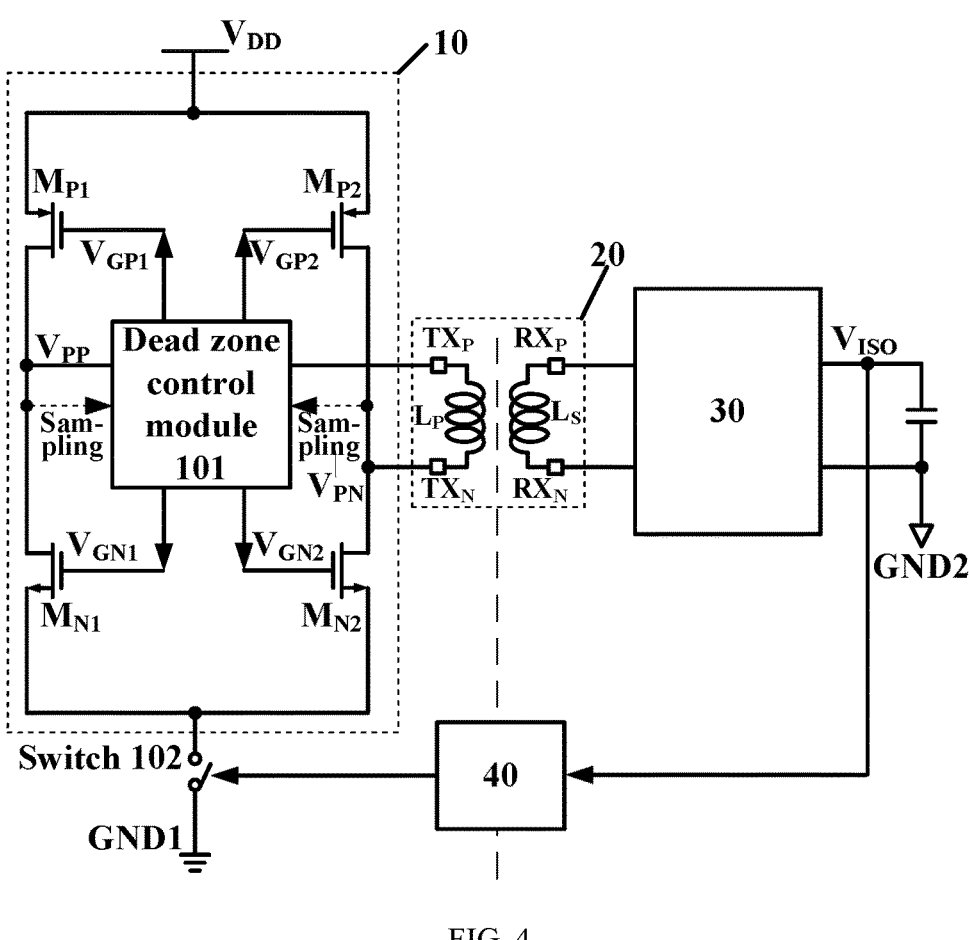
FIG. 4 is a block diagram of an isolated power supply chip based on a symmetrical Class-D oscillator with dead zone control according to the embodiments of the present disclosure.
Figure 6:
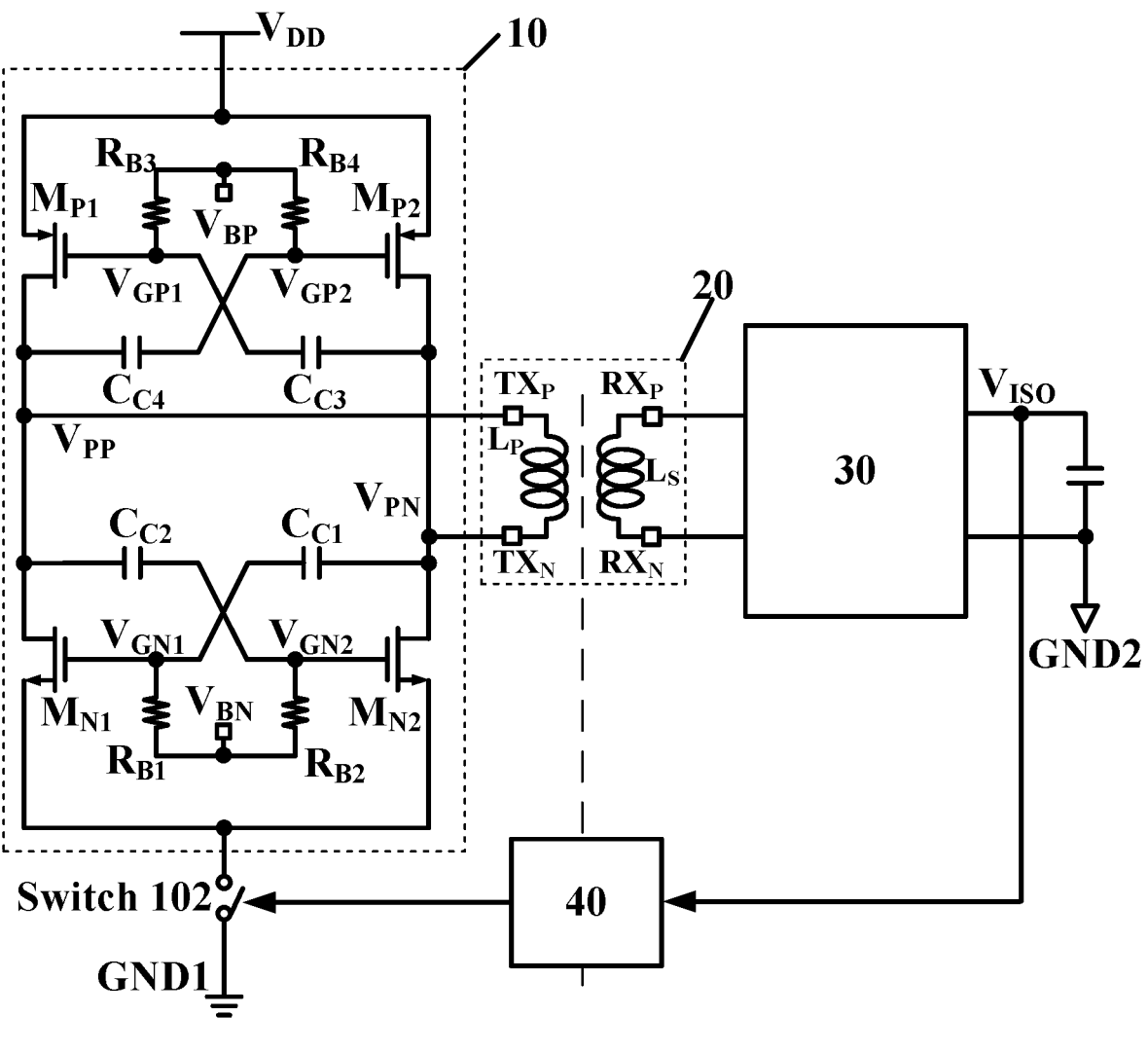
FIG. 6 is a specific block diagram of an isolated power supply chip based on a symmetrical Class-D oscillator with dead zone control according to the embodiments of the present disclosure.

FIG. 4 is a block diagram of an isolated power supply chip based on a symmetrical Class-D oscillator with dead zone control according to the embodiments of the present disclosure. FIG. 6 is a specific block diagram of an isolated power supply chip based on a symmetrical Class-D oscillator with dead zone control according to the embodiments of the present disclosure.

In the embodiments of the present disclosure, an isolated power supply chip based on a symmetrical Class-D oscillator with dead zone control is provided. As shown in FIGS. 4 and 6, the isolated power supply chip includes:

a transmitting stage oscillator circuit 10 connected to a power supply $V_{DD}$ and a ground GND1, the transmitting stage oscillator circuit is configured to invert an input DC voltage into differential high-frequency oscillation power signals and input the differential high-frequency oscillation power signals to a primary coil $L_P$ of a subsequent transformer 20;

a rectifier circuit connected to a secondary coil of the transformer and configured to rectify the differential high-frequency oscillation power signals to output a DC voltage signal; and a feedback control circuit connected to the rectifier circuit and configured to feed back the DC voltage signal to the transmitting stage oscillator circuit, thereby modulating and stabilizing the DC voltage signal;

the transmitting stage oscillator circuit includes: a dead zone control module, and a NMOS transistor group and a PMOS transistor group connected to the dead zone control module that are symmetrically arranged, the dead zone control module is configured to control a turn-on and a turn-off of the NMOS transistor group and the PMOS transistor group to eliminate a short circuit current between the power supply and the ground.

In the embodiments of the present disclosure, as shown in FIGS. 4 and 6, the transformer 20 is an isolation device used to transfer AC power, and is composed of a primary coil $L_P$ and a secondary coil $L_S$. The upper end of the primary coil of the transformer 20 is $TX_P$ and the lower end is $TX_N$, and the upper end of the secondary coil is $RX_P$ and the lower end is $RX_N$. The transmitting stage oscillator circuit 10 is configured to invert an input DC voltage $V_{DD}$ into differential high-frequency oscillation power signals $V_{PP}$ and $V_{PN}$ and output the differential high-frequency oscillation power signals from $T_{XP}$ end and $TX_N$ end to the primary coil $L_P$ of the micro-transformer 20. The rectifier circuit 30 is configured to receive the high-frequency oscillation power signals generated by the transmitting stage oscillator circuit 10 and transmitted to the secondary coil $L_S$ of the transformer 20 through $RX_P$ end and $RX_N$ end and rectify the high-frequency oscillation power signals into an output DC voltage signal. The feedback control circuit 40 is configured to feed back the output voltage signal and modulate a stable output voltage $V_{ISO}$.

According to the embodiments of the present disclosure, the NMOS transistor group includes a first NMOS transistor $M_{N1}$ and a second NMOS transistor $M_{N2}$. The PMOS transistor group includes a first PMOS transistor $M_{P1}$ and a second PMOS transistor $M_{P2}$. The voltage node $V_{PP}$ of the transmitting stage oscillator circuit 10 is connected to the $T_{XP}$ end of the transformer 20, and the voltage node $V_{PN}$ is connected to the $TX_N$ end of the transformer 20.

According to the embodiments of the present disclosure, the dead zone control module 101 is configured to control the turn-on and the turn-off of the NMOS transistor group and the PMOS transistor group by sampling the high-frequency oscillation power signals at two ends of the primary coil of the transformer, so as to achieve a dead zone control.

According to the embodiments of the present disclosure, the dead zone control module is configured to control a turn-on and a turn-off of each power transistor of the NMOS transistor group and PMOS transistor group by outputting a control voltage signal according to the sampled high-frequency oscillation power signals at two ends of the primary coil of the transformer, so as to achieve the dead zone control. For example, the dead zone control module 101 outputs four voltages $V_{GN1}$, $V_{GN2}$, $V_{GP1}$ and $V_{GP1}$ to control four power transistors $M_{N1}$, $M_{N2}$, $M_{P1}$ and $M_{P2}$ respectively by sampling the oscillation signals $V_{PP}$ and $V_{PN}$.

According to the embodiments of the present disclosure, the dead zone control module 101 is configured to set the sequence of turn-on and turn-off of the NMOS transistor group and PMOS group. The gate voltages $V_{GN1}$, $V_{GN2}$, $V_{GP1}$ and $V_{GP1}$ of the four MOS transistors are controlled by sampling the oscillation signals $V_{PP}$ and $V_{PN}$ at two ends of the primary coil $L_P$ of the transformer 20, so as to achieve dead zone control.

According to the embodiments of the present disclosure, the isolated power supply chip further includes a switch 102, one end of the switch 102 is connected to the ground or the power supply, and another end of the switch 102 is connected to the transmitting stage oscillator circuit. The switch is configured to control whether the transmitting stage oscillator circuit oscillates or not by switching on and off according to the DC voltage signal fed back by the feedback control circuit. For example, one end of the switch 102 may be connected to the source electrode of $M_{N1}$ and the source electrode of $M_{N2}$, and the other end may be connected to the ground GND1. The switch may also be changed to two switches, for one of the switches, one end of the switch is connected to the gate electrode of $M_{N1}$ and the other end is connected to ground, and for the other one of the switches, one end of the switch is connected to the gate electrode of $M_{N2}$ and the other end connected to ground, and the switches control the oscillator by controlling the high and low levels of the gate electrode of $M_{N1}$ and the gate electrode of $M_{N2}$. Alternatively, the switch may also be changed to two switches, for one of the switches, one end of the switch is connected to the gate electrode of $M_{P1}$ and the other end is connected to $V_{DD}$, and for the other one of the switches, one end of the switch is connected to the gate electrode of $M_{P2}$ and the other end connected to $V_{DD}$, and the switches control the oscillator by controlling the high and low levels of the gate electrode of $M_{P1}$ and the gate electrode of $M_{P2}$.

Figure 5:
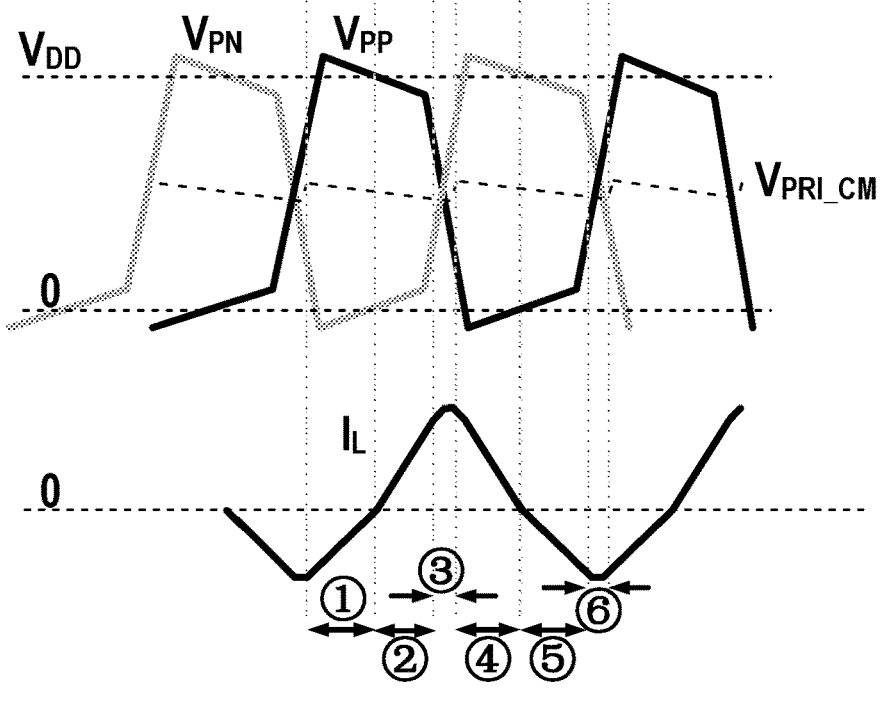
FIG. 5 is a schematic diagram of a state and waveform of a transmitting stage oscillator circuit according to the embodiments of the present disclosure.

FIG. 5 is a schematic diagram of a state and waveform of a transmitting stage oscillator circuit according to the embodiments of the present disclosure.

According to the embodiments of the present disclosure, the transmitting stage oscillator circuit comprises states of:

state 1 (①): the second NMOS transistor and the first PMOS transistor are turned on, and an inductor current $I_L$ is negative, that is, it flows from GND1 to $V_{DD}$ and gradually becomes smaller, $V_{PP}$ is greater than $V_{DD}$, and $V_{PN}$ is less than 0;

state 2 (②): the second NMOS transistor and the first PMOS transistor are turned on, and the inductor current $I_L$ is positive, that is, it flows from $V_{DD}$ to GND1 and gradually becomes greater, $V_{PP}$ is smaller than $V_{DD}$, and $V_{PN}$ is greater than 0;

state 3 (③): to avoid short-circuit current, the second NMOS transistor and the first PMOS transistor are turned off first, and voltages $V_{GN2}$ and $V_{GP1}$ output by the dead zone control module reach $V_{THN}$ and $V_{DD}-|V_{THP}|$, respectively, while a dead time is generated, all four power transistors are turned off, and the inductor current $I_L$ freewheels;

state 4 (④): a first NMOS transistor and a second PMOS transistor are turned on, and the inductor current $I_L$ is positive, that is, it flows from GND1 to $V_{DD}$ and gradually becomes smaller, $V_{PN}$ is greater than $V_{DD}$, and $V_{PP}$ is less than 0;

state 5 (⑤): the first NMOS transistor and the second PMOS transistor are turned on, and the inductor current $I_L$ is negative, that is, it flows from $V_{DD}$ to GND1 and gradually becomes greater, $V_{PN}$ is smaller than $V_{DD}$, and $V_{PP}$ is greater than 0; and state 6 (⑥): to avoid short-circuit current, the first NMOS transistor and the second PMOS transistor are turned off first, voltages $V_{GN1}$ and $V_{GP2}$ output by the dead zone control module reach $V_{THN}$ and $V_{DD}-|V_{THP}|$, respectively, while a dead time is generated, all four power transistors are turned off, and the inductor current $I_L$ freewheels;

where a threshold voltage of the NMOS transistor group is $V_{THN}$, a threshold voltage of the PMOS transistor group is $V_{THP}$, a high-frequency oscillation power signal corresponding to a first end ($T_{XP}$ end) of the primary coil of the transformer is $V_{PP}$, a high-frequency oscillation power signal corresponding to a second end ($TX_N$ end) of the primary coil of transformer is $V_{PN}$, the inductor current generated by the primary coil of the transformer is $I_L$, and a voltage of the power supply is $V_{DD}$, $V_{GN1}$ is a gate voltage of the first NMOS transistor output by the dead zone control module, $V_{GN2}$ is a gate voltage of the second NMOS transistor output by the dead zone control module, $V_{GP1}$ is a gate voltage of the first PMOS transistor output by the dead zone control module, and $V_{GP2}$ is a gate voltage of the second PMOS transistor output by the dead zone control module.

According to the embodiments of the present disclosure, as shown in FIG. 4 and FIG. 6, the dead zone control module includes a first bias voltage $V_{BN}$, a second bias voltage $V_{BP}$, a first bias resistor $R_{B1}$, a second bias resistor $R_{B2}$, a third bias resistor $R_{B3}$, a fourth bias resistor $R_{B4}$, a first coupling capacitor $C_{C1}$, a second coupling capacitor $C_{C2}$, a third coupling capacitor $C_{C3}$, and a fourth coupling capacitor $C_{C4}$.

A gate electrode of the first NMOS transistor $M_{N1}$ is connected to a drain electrode of the second NMOS transistor $M_{N2}$ through the first coupling capacitor $C_{C1}$, a gate electrode of the second NMOS transistor $M_{N2}$ is connected to a drain electrode of the first NMOS transistor $M_{N1}$ through the second coupling capacitor $C_{C2}$, a gate electrode of the first PMOS transistor $M_{P1}$ is connected to a drain electrode of the second PMOS transistor $M_{P2}$ through the third coupling capacitor $C_{C3}$, and a gate electrode of the second PMOS transistor $M_{P2}$ is connected to a drain electrode of the first PMOS transistor $M_{P1}$ through the fourth coupling capacitor $C_{C4}$.

The first bias voltage $V_{BN}$ is connected to the gate electrode $V_{GN1}$ of the first NMOS transistor $M_{N1}$ through the first bias resistor $R_{B1}$, and is connected to the gate electrode $V_{GN2}$ of the second NMOS transistor $M_{N2}$ through the second bias resistor $R_{B2}$. The second bias voltage $V_{BP}$ is connected to the gate electrode $V_{GP1}$ of the first PMOS transistor $M_{P1}$ through the third bias resistor $R_{B3}$, and is connected to the gate electrode $V_{GP2}$ of the second PMOS transistor $M_{P2}$ through the fourth bias resistor $R_{B4}$.

The source electrode of the first NMOS transistor $M_{N1}$ and the source electrode of the second NMOS transistor $M_{N2}$ are connected to one end of the switch, the other end of the switch is connected to ground, and the source electrode of the first PMOS transistor $M_{P1}$ and source electrode of the second PMOS transistor $M_{P2}$ are connected to the power supply $V_{DD}$. The drain electrode of the first NMOS transistor $M_{N1}$ and the drain electrode of the second PMOS transistor $M_{P2}$ are connected to the $T_{XP}$ end of the primary coil $L_P$ of the transformer 20, and the drain electrode of the second NMOS transistor $M_{N2}$ and the drain electrode of the second PMOS transistor $M_{P2}$ are connected to the $TX_N$ end of the primary coil $L_P$ of the transformer 20.

Further, for the switch 102 in the oscillator circuit 10 provided by the present disclosure, one end of the switch 102 may be connected to the source electrode of the first NMOS transistor $M_{N1}$ and the source electrode of the second NMOS transistor $M_{N2}$, and the other end may be connected to the ground GND1. The switch may also be changed to two switches, for one of the switches, one end of the switch is connected to the gate electrode of the first NMOS transistor $M_{N1}$ and the other end is connected to ground, and for the other one of the switches, one end of the switch is connected to the gate electrode of the second NMOS transistor $M_{N2}$ and the other end connected to ground, and the switches control the oscillator by controlling the high and low levels of the gate electrode of the first NMOS transistor $M_{N1}$ and the gate electrode of the second NMOS transistor $M_{N2}$. Alternatively, the switch may also be changed to two switches, for one of the switches, one end of the switch is connected to the gate electrode of the first PMOS transistor $M_{P1}$ and the other end is connected to $V_{DD}$, and for the other one of the switches, one end of the switch is connected to the gate electrode of the second PMOS transistor $M_{P2}$ and the other end connected to $V_{DD}$, and the switches control the oscillator by controlling the high and low levels of the gate electrode of the first PMOS transistor $M_{P1}$ and the gate electrode of the second PMOS transistor $M_{P2}$.

As shown in FIG. 6, the symmetrical Class-D oscillator with dead zone control provided by the present disclosure couples the differential high-frequency oscillation power signals $V_{PP}$ and $V_{PN}$ generated by the oscillation of the oscillator to the gate electrodes $V_{GN1,2}$ and $V_{GP1,2}$ of the MOS transistors $M_{N1}$, $M_{N2}$, $M_{P1}$ and $M_{P2}$ respectively through the coupling capacitors $C_{C1-4}$. The ratio of the coupling capacitance value to the gate parasitic capacitance $C_{GS}$ of the MOS transistor is used to determine the swing of the MOS transistor gate voltage signal.

The bias DC voltages $V_{BN}$ and $V_{BP}$ respectively set the gate common-mode voltage values of the NMOS transistor group and PMOS transistor group in the Class-D oscillator through the bias resistors $R_{B1-4}$. When $V_{BN}$ and $V_{BP}$ are not used, the gate common-mode voltages of the NMOS transistor group and the PMOS transistor group are both $V_{DD}/2$. After using $V_{BN}$ and $V_{BP}$, the gate common-mode voltages of the NMOS transistor group and PMOS transistor group are $V_{BN}$ and $V_{BP}$ respectively. In order to effectively control the dead time of the switching transistor, it is required to set the turn-on and turn-off sequence of the NMOS transistor group and PMOS transistor group.

Figure 7A:
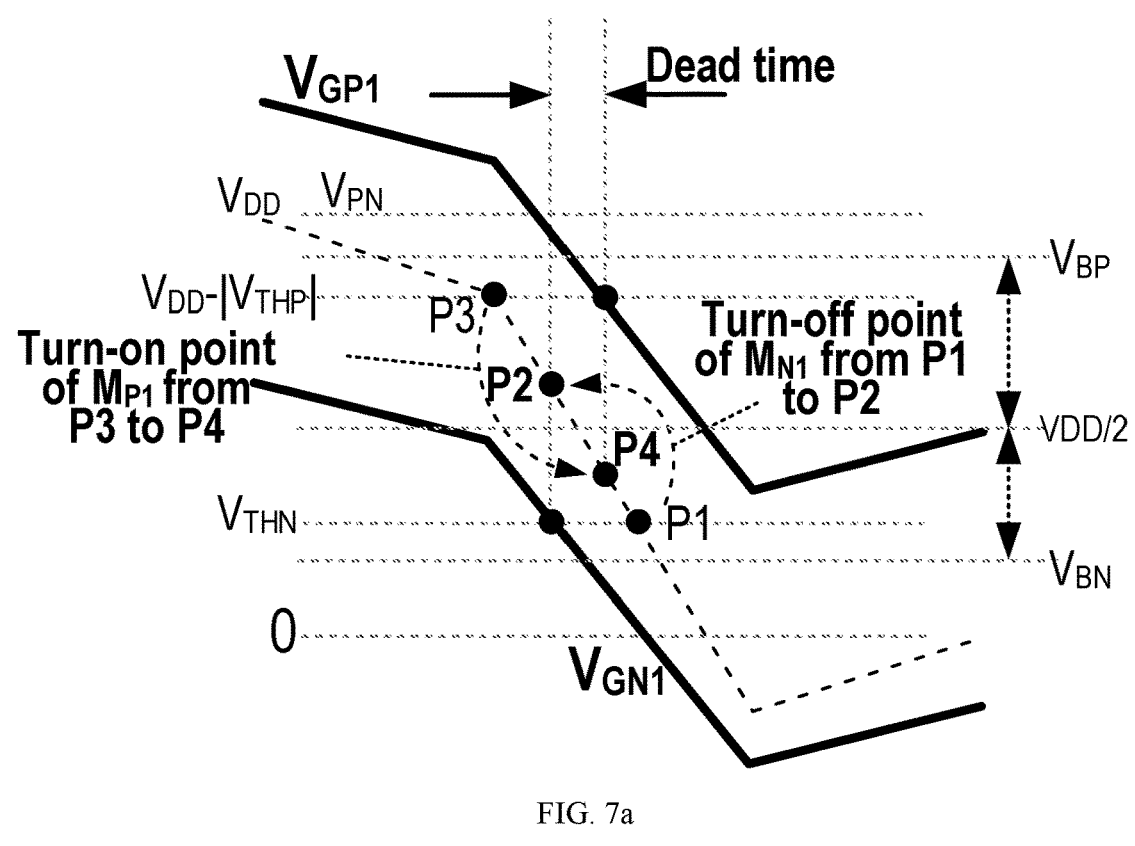
FIG. 7a is a schematic diagram of a dead zone control of a decreasing process of a differential high-frequency oscillation power signal $V_{PN}$ according to the embodiments of the present disclosure.
Figure 7B:
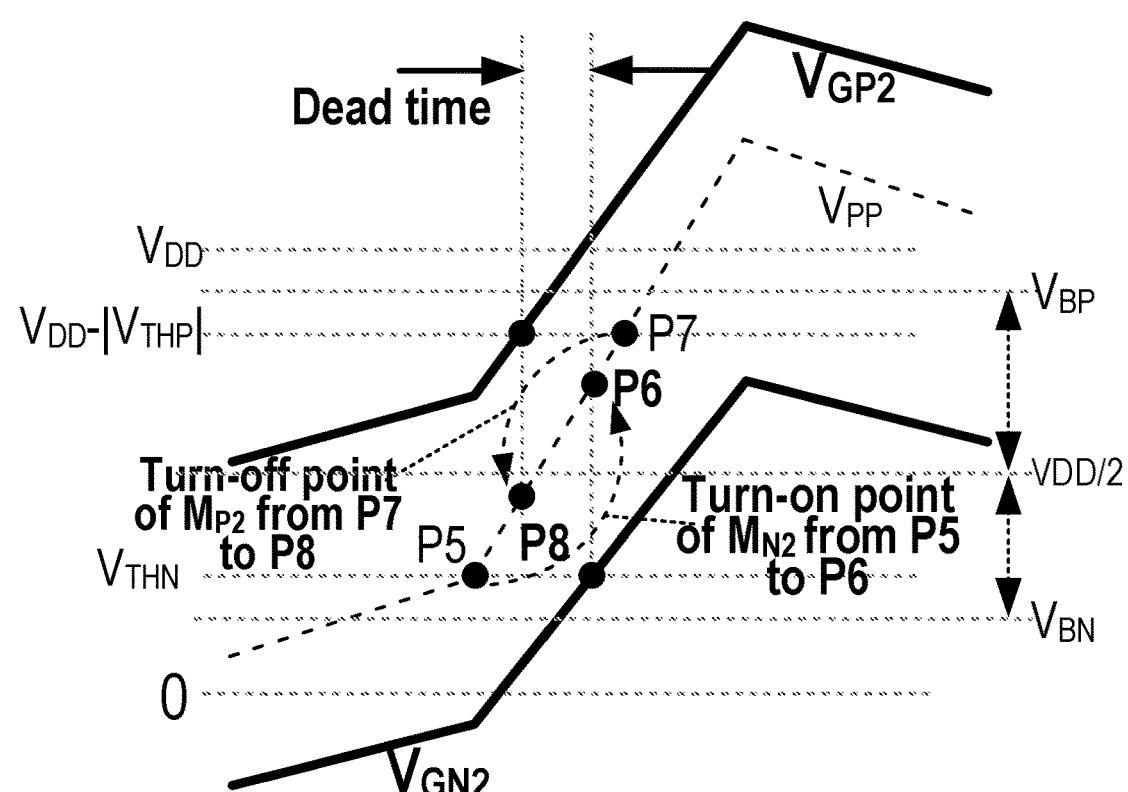
FIG. 7b is a schematic diagram of a dead zone control of an increasing process of a differential high-frequency oscillation power signal $V_{PP}$ according to the embodiments of the present disclosure.

FIG. 7a is a schematic diagram of a dead zone control of a decreasing process of a differential high-frequency oscillation power signal $V_{PN}$ according to the embodiments of the present disclosure. FIG. 7b is a schematic diagram of a dead zone control of an increasing process of a differential high-frequency oscillation power signal $V_{PP}$ according to the embodiments of the present disclosure.

According to the embodiments of the present disclosure, as shown in FIG. 6, FIG. 7a and FIG. 7b, during the decreasing process of the differential high-frequency oscillation power signal $V_{PN}$, the bias voltage $V_{BN}$ is used to pull down the gate common-mode voltage of the NMOS transistor group ($M_{N1}$ and $M_{N2}$) to $V_{BN}$, and the bias voltage $V_{BP}$ is used to raise the gate common-mode voltage of the PMOS transistor group ($M_{P1}$ and $M_{P2}$) to $V_{BP}$. Compared with FIG. 3, it may be found that the original turn-off point P1 of $M_{N1}$ is when the $V_{PN}$ is $V_{THN}$, while the point currently corresponding to $V_{PN}$ is P2 when the gate-source voltage of $M_{N1}$ is $V_{THN}$, and the turn-off point of $M_{N1}$ moves from point P1 to point P2 ($V_{PN,P2}=V_{THN}+(V_{DD}/2-V_{BN})$); the original turn-on point P3 of $M_{P1}$ is when the $V_{PN}$ is $V_{DD}$-$|V_{THP}|$, while the point currently corresponding to $V_{PN}$ is P4 ($V_{PN,P4}=V_{DD}-|V_{THP}|-(V_{BP}-V_{DD}/2)$) when the gate-source voltage of $M_{P1}$ is $|V_{THP}|$, and the turn-on point of $M_{P1}$ moves from point P3 to point P4. If point P2 is earlier than point P4 ($V_{PN,P4}>V_{PN,P2}$), the conditional equation (4) for generating dead time is derived, and $M_{N1}$ is turned off first before $M_{P1}$ is turned on. Therefore, the interval from P2 to P4 is the dead time when both $M_{N1}$ and $M_{P1}$ are turned off, and the short-circuit current from $V_{DD}$ to ground is effectively eliminated.

$$V_{BP} - V_{BN} > V_{DD} - |V_{THP}| - V_{THN}; \qquad (4)$$

In the same way, the increasing process of the differential high-frequency oscillation power signal $V_{PP}$, the turn-on point of $M_{N2}$ moves from point P5 to point P6, and the turn-off point of $M_{P2}$ moves from point P7 to point P8. If point P8 is earlier than point P6 ($V_{PP,P6}>V_{PP,P8}$), the conditional equation (4) for generating dead time may also be derived, and $M_{P2}$ is turned off first before $M_{N2}$ is turned on. As shown in FIG. 5, $V_{PP}$ and $V_{PN}$ are differential high-frequency oscillation power signals at two ends of the transformer 20. When $V_{PN}$ is high, $M_{N1}$ and $M_{P2}$ are turned on. Since the direction of the inductor current in the previous state is from $T_{XP}$ to $TX_N$, and the inductor current may not have an abrupt change, the inductor current $I_L$ flows from the ground GND1 to $V_{DD}$ through $M_{N1}$ and $M_{P2}$, the voltage of $V_{PN}$ exceeds $V_{DD}$ and the voltage of $V_{PP}$ is lower than 0. Due to the on-resistance of $M_{N1}$ and $M_{P2}$, $V_{PN}$ may gradually decrease and $V_{PP}$ may gradually increase. When $V_{PN}$ is $V_{DD}$, $V_{PP}$ is 0, and the inductor current is 0 at this time, until $M_{N1}$ is turned off when the above conditions in the dead zone control are reached. Next, $M_{P1}$ is turned on, $V_{PN}$ is pulled low, and the Class-D oscillator enters the next state. The same principal applies when $V_{PP}$ is high, thereby offsetting the short-circuit current between the power supply and ground generated in states 3 and 6. Moreover, the above dead zone control method does not affect the symmetry of the provided Class-D oscillator, the common-mode voltage generated at two ends of the primary coil $L_P$ of the transformer 20 is still $V_{DD}/2$. Therefore, this topology has the effect of suppressing common-mode current and reducing EMI radiation.

The present disclosure provides an isolated power supply chip based on a symmetrical Class-D oscillator with dead zone control. Through the symmetrical Class-D oscillator topology, the common-mode current is suppressed to reduce dipole radiation, and a low EMI radiation solution may be achieved at the device level. The oscillation amplitude of the symmetrical Class-D oscillator used is limited to the power supply voltage $V_{DD}$, so there is no need to use high-voltage LDMOS, and only low-voltage MOS transistors are needed. The low-voltage MOS transistors have lower on-resistance, which effectively improves the conversion efficiency of the oscillator and reduces process costs. The provided symmetrical Class-D oscillator effectively solves the problem of instant short-circuit current in the traditional complementary Class-D oscillator. A dead-zone control technology is provided to effectively eliminate the short-circuit current of the complementary Class-D oscillator, which improves the conversion efficiency of the oscillator without affecting the original symmetry of the topology, and increases the service life of the power transistor.

The above descriptions are only specific embodiments of the present disclosure and are not construed as limiting the present disclosure. Any modifications and improvements made within the spirit and principles of the present disclosure shall be contained in the scope of protection of the present disclosure.

What is claimed is:

1. An isolated power supply chip based on a symmetrical Class-D oscillator with dead zone control, with electromagnetic interference radiation caused by common-mode current suppressed, the isolated power supply chip comprising:

a transmitting stage oscillator circuit connected to a power supply and a ground, wherein the transmitting stage oscillator circuit is configured to invert an input DC voltage into differential high-frequency oscillation power signals and input the differential high-frequency oscillation power signals to a primary coil of a subsequent transformer;

a rectifier circuit connected to a secondary coil of the transformer and configured to rectify the differential high-frequency oscillation power signals to output a DC voltage signal; and a feedback control circuit connected to the rectifier circuit and configured to feed back the DC voltage signal to the transmitting stage oscillator circuit, so as to modulate and stabilize the DC voltage signal;

wherein the transmitting stage oscillator circuit comprises: a dead zone control module, and a NMOS transistor group and a PMOS transistor group connected to the dead zone control module that are symmetrically arranged, the dead zone control module is configured to control a turn-on and a turn-off of the NMOS transistor group and the PMOS transistor group to eliminate a short circuit current between the power supply and the ground, wherein the NMOS transistor group comprises a first NMOS transistor and a second NMOS transistor, the PMOS transistor group comprises a first PMOS transistor and a second PMOS transistor, the dead zone control module comprises a first bias voltage, a second bias voltage, a first bias resistor, a second bias resistor, a third bias resistor, a fourth bias resistor, the first bias voltage is connected to a gate electrode of the first NMOS transistor through the first bias resistor, and is connected to a gate electrode of the second NMOS transistor through the second bias resistor; the second bias voltage is connected to a gate electrode of the first PMOS transistor through the third bias resistor, and is connected to a gate electrode of the second PMOS transistor through the fourth bias resistor, the first bias voltage and the second bias voltage satisfy:

$$V_{BP} - V_{BN} > V_{DD} - |V_{THP}| - V_{THN}$$

wherein $V_{BN}$ represents the first bias voltage, $V_{BP}$ represents the second bias voltage, $V_{DD}$ represents a voltage of the power supply, $V_{THN}$ represents a threshold voltage of the NMOS transistor group, $V_{THP}$ represents a threshold voltage of the PMOS transistor group, wherein the drain electrode of the first NMOS transistor and the drain electrode of the first PMOS transistor are connected to a first end of the primary coil, and the drain electrode of the second NMOS transistor and the drain electrode of the second PMOS transistor are connected to a second end of the primary coil, so as to input the differential high-frequency oscillation power signals to the first end and the second end of the primary coil respectively.

2. The isolated power supply chip according to claim 1, wherein the dead zone control module is configured to control the turn-on and the turn-off of the NMOS transistor group and the PMOS transistor group by sampling the high-frequency oscillation power signals at the first end and the second end of the primary coil of the transformer, so as to achieve a dead zone control.

3. The isolated power supply chip according to claim 2, wherein the dead zone control module is configured to control a turn-on and a turn-off of each power transistor of the NMOS transistor group and the PMOS transistor group by outputting a control voltage signal according to the sampled high-frequency oscillation power signals at the first end and the second end of the primary coil of the transformer, so as to achieve the dead zone control.

4. The isolated power supply chip according to claim 1, further comprising:

a switch, wherein one end of the switch is connected to the ground or the power supply, and another end of the switch is connected to the transmitting stage oscillator circuit, the switch is configured to control whether the transmitting stage oscillator circuit oscillates or not by switching on and switching off according to the DC voltage signal fed back by the feedback control circuit.

5. The isolated power supply chip according to claim 1, wherein the transmitting stage oscillator circuit comprises states of:

state 1: the second NMOS transistor and the first PMOS transistor are turned on, and an inductor current $I_L$ is negative;

state 2: the second NMOS transistor and the first PMOS transistor are turned on, and the inductor current $I_L$ is positive;

state 3: the second NMOS transistor and the first PMOS transistor are turned off, and voltages $V_{GN2}$ and $V_{OPI}$ output by the dead zone control module reach $V_{THN}$ and $V_{DD} - |V_{THP}|$, respectively, while a dead time is generated, all four power transistors are turned off, and the inductor current $I_L$ freewheels;

state 4: the first NMOS transistor and the second PMOS transistor are turned on, and the inductor current $I_L$ is positive;

state 5: the first NMOS transistor and the second PMOS transistor are turned on, and the inductor current $I_L$ is negative; and state 6: the first NMOS transistor and the second PMOS transistor are turned off, voltages $V_{GN1}$ and $V_{GP2}$ output by the dead zone control module reach $V_{THN}$ and $V_{DD} - |V_{THP}|$, respectively, while a dead time is generated, all four power transistors are turned off, and the inductor current $I_L$ freewheels;

where a high-frequency oscillation power signal corresponding to the first end of the primary coil of the transformer is $V_{PP}$, a high-frequency oscillation power signal corresponding to the second end of the primary coil of the transformer is $V_{PN}$, the inductor current generated by the primary coil of the transformer is $I_L$, $V_{GN1}$ is a gate voltage of the first NMOS transistor output by the dead zone control module, $V_{GN2}$ is a gate voltage of the second NMOS transistor output by the dead zone control module, $V_{GP1}$ is a gate voltage of the first PMOS transistor output by the dead zone control module, and $V_{GP2}$ is a gate voltage of the second PMOS transistor output by the dead zone control module.

6. The isolated power supply chip according to claim 1, wherein the dead zone control module further comprises a first coupling capacitor, a second coupling capacitor, a third coupling capacitor, and a fourth coupling capacitor.

7. The isolated power supply chip according to claim 6, wherein the gate electrode of the first NMOS transistor is connected to a drain electrode of the second NMOS transistor through the first coupling capacitor, the gate electrode of the second NMOS transistor is connected to a drain electrode of the first NMOS transistor through the second coupling capacitor, the gate electrode of the first PMOS transistor is connected to a drain electrode of the second PMOS transistor through the third coupling capacitor, and the gate electrode of the second PMOS transistor is connected to a drain electrode of the first PMOS transistor through the fourth coupling capacitor.

8. The isolated power supply chip according to claim 1, wherein the first bias voltage or the second bias voltage is used to adjust a common-mode voltage of the NMOS transistor group or the PMOS transistor group, so as to achieve the dead zone control.

* * * * *